United States Patent
Suzuki et al.

(10) Patent No.: US 6,924,666 B2
(45) Date of Patent: Aug. 2, 2005

(54) INTEGRATED LOGIC CIRCUIT AND HIERARCHICAL DESIGN METHOD THEREOF

(75) Inventors: Kenji Suzuki, Kawasaki (JP); Toru Osajima, Kawasaki (JP); Shogo Tajima, Kawasaki (JP); Shigenobu Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 10/263,071

(22) Filed: Oct. 3, 2002

(65) Prior Publication Data

US 2003/0067326 A1 Apr. 10, 2003

(30) Foreign Application Priority Data

Oct. 9, 2001 (JP) ........................................ 2001-311004

(51) Int. Cl.$^7$ .............................................. H01L 25/00
(52) U.S. Cl. ........................................ 326/47; 326/101
(58) Field of Search ..................... 326/47, 101

(56) References Cited

U.S. PATENT DOCUMENTS 6,501,301 B2 * 12/2002 Taguchi ...................... 326/101

FOREIGN PATENT DOCUMENTS

JP 62-101047 5/1987

* cited by examiner

Primary Examiner—Daniel D. Chang
(74) Attorney, Agent, or Firm—Staas & Halsey LLP

(57) ABSTRACT

Modules 14 to 18 are disposed in a chip 10, and the module 14 includes a plurality of external buffer cells 20 disposed along the peripheral of the module 14, and an internal circuit 21 disposed inside the plurality of external buffer cells 20. Input and output of signals is made between the internal circuit 21 and the external circuit, through the external buffer cells 20. The output-stage transistor of each external buffer cell has a larger size than the transistor size of the internal circuit 21. The external buffer cells 20 have a driving capability for enabling direct driving of a transistor inside the chip through a wire having the maximum Manhattan length of a module-disposed region in on chip. If the disposed area of the plurality of external buffer cells 20 is not sufficient, the size of the module is enlarged, or repartition is made to reform the modules so that the plurality of external buffer cells 20 have their sufficient disposed area.

6 Claims, 8 Drawing Sheets

INTEGRATED LOGIC CIRCUIT AND HIERARCHICAL DESIGN METHOD THEREOF

BACKGROUND OF THE INVENTION

1. Field of the Invention

The present invention relates to an integrated logic circuit provided with modules and a hierarchical design method thereof.

2. Description of the Related Art

As an integrated logic circuit has been developed to have higher efficiency and larger scale, there occurs a case where thousands of input and Output-stages are included in the top level of hierarchical design. On the other hand, as the circuit components become smaller in size, logic gates become weaker in driving capability, and several repeater cells (buffer gates) must be inserted on the route for wiring a long path between modules. For this reason, the configuration becomes complicated, the number of timing-adjusting positions becomes larger, and timing-error checking and layout correcting are required so many repeated times, in result of extending the design period of semiconductor logic circuit.

SUMMARY OF THE INVENTION

Therefore, it is an object of the present invention to provide an integrated logic circuit and a hierarchical design method thereof which simplifies the configuration of connections between modules of the top level and reduces the number of timing-adjusting positions, so as to shorten the design period.

In one aspect of the present invention, there is provided an integrated logic circuit having a module disposed inside a chip, wherein the module comprises an internal circuit; and a plurality of external buffer cells, disposed along a periphery of the internal circuit, through which signal input/output is made between the internal circuit and an external circuit that is inside the chip and outside the plurality of external buffer cells.

According to this configuration, input and output of signals between the internal and external circuits of the module is made always through the external buffer cells of the module, thereby simplifying the configuration of connection, reducing the number of timing-error adjusting positions, and reducing the number of repeated times of timing-error checking and layout correcting processes, compared with the prior art, in result of shortening the design period.

For example, an output-stage transistor of the external buffer cells has a larger size than a transistor size of the internal circuit, and the external buffer cells have a driving capability for enabling direct driving of a transistor inside the chip through a wire having a maximum Manhattan length of a module-disposed region on the chip.

This configuration increases the above-mentioned advantages.

If the disposed area of the plurality of external buffer cells is not sufficient, the size of the module is enlarged, or partition and amendment is made for the modules so that the plurality of external buffer cells have their sufficient disposed area.

DESCRIPTION OF THE PREFERRED EMBODIMENT

Hereinafter, the present invention will be described in more detail referring to the drawings.

Figure 1:
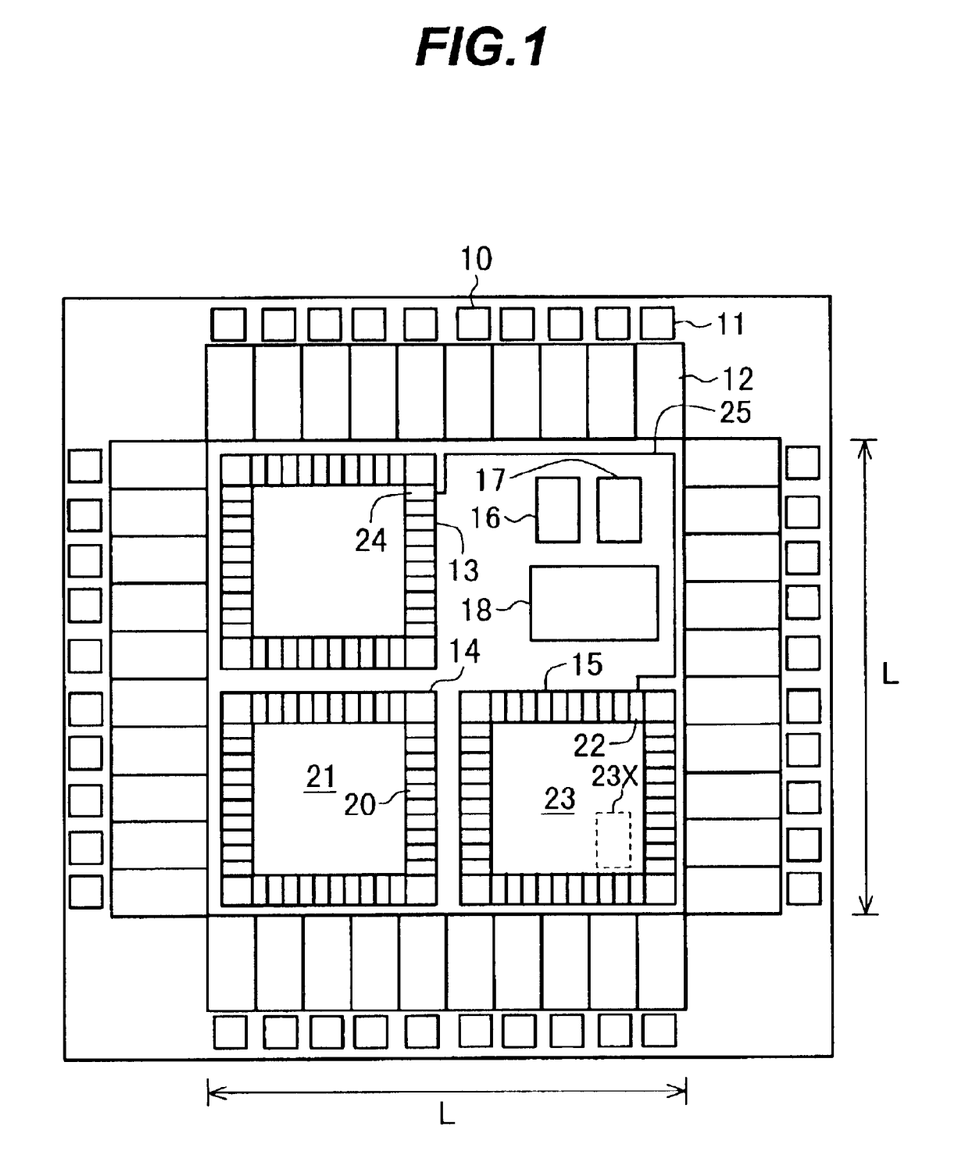
FIG. 1 is a view showing an arrangement of modules of the top level in hierarchical design of a chip where an integrated logic circuit is formed, according to an embodiment of the present invention.

FIG. 1 is a view showing an arrangement of modules of the top level in hierarchical design of a chip 10 where an integrated logic circuit is formed.

A plurality of pads 11 are disposed along the periphery of the chip 10, I/O cells 12 are formed corresponding to each of the plurality of pads 11, and modules 13 to 18 are formed inside the plurality of I/O cells 12.

The modules 16 to 18 belong to the conventional hard macro and have been optimized in design, and the positions of not-shown terminals of the top level have been fixed.

Figure 2A:
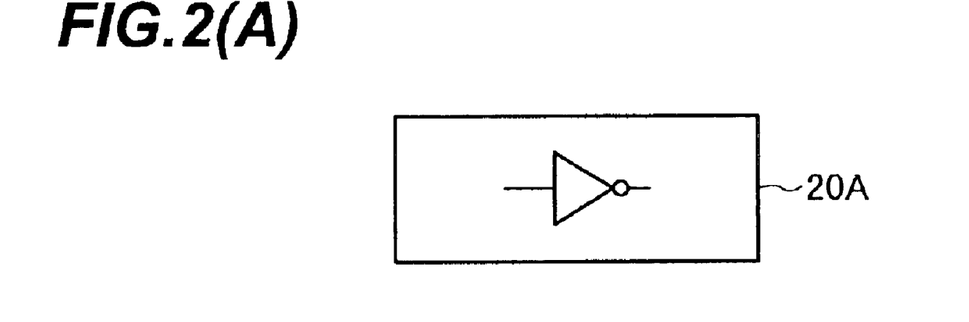
FIGS. 2(A) to 2(C) are views showing a series of circuits of external buffer cells included in the module shown in FIG. 1.
Figure 2B:
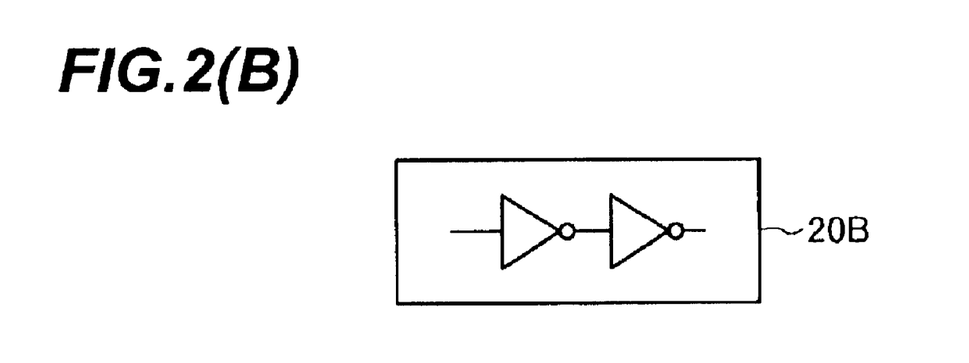
Figure 2C:
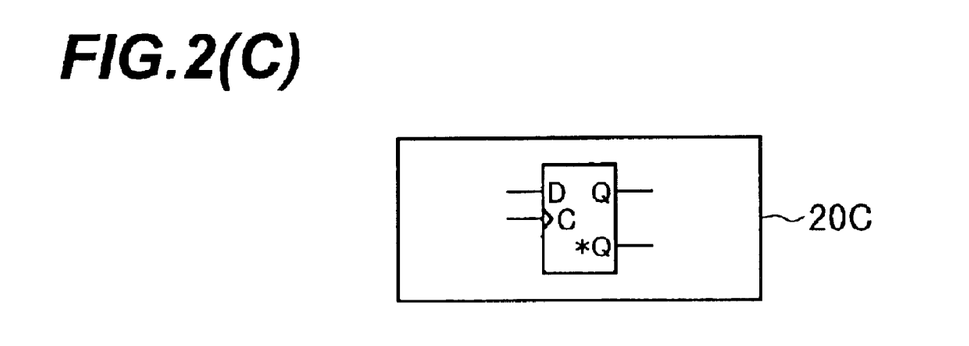

On the other hand, each of modules 13 to 15 has a featured configuration according to this embodiment of the present invention. For example, the module 14 includes a plurality of external buffer cells 20 disposed along the periphery thereof and an internal circuit 21 disposed inside the buffer cells 20, and through the buffer cells 20, input and output of signals is made between the internal circuit 21 and circuits outside the module 14. In order to reduce the length of wires in the top level, the arrangement of external buffer cells 20 is determined after the arrangement of modules has been determined by performing a temporary wiring in the top level. Each of the plurality of external buffer cells 20 has the same configuration, and for example, as shown in FIGS. 2(A) to 2(C), it includes an internal buffer cell 20A composed of one inverter, an external buffer cell 20B composed of two cascaded inverters, or an external buffer cell 20C composed of one D flip-flop. Input-external buffer cells have the same circuit configuration as output-external buffer cells, but they are opposite to each other in the arrangement direction.

Figure 3A:
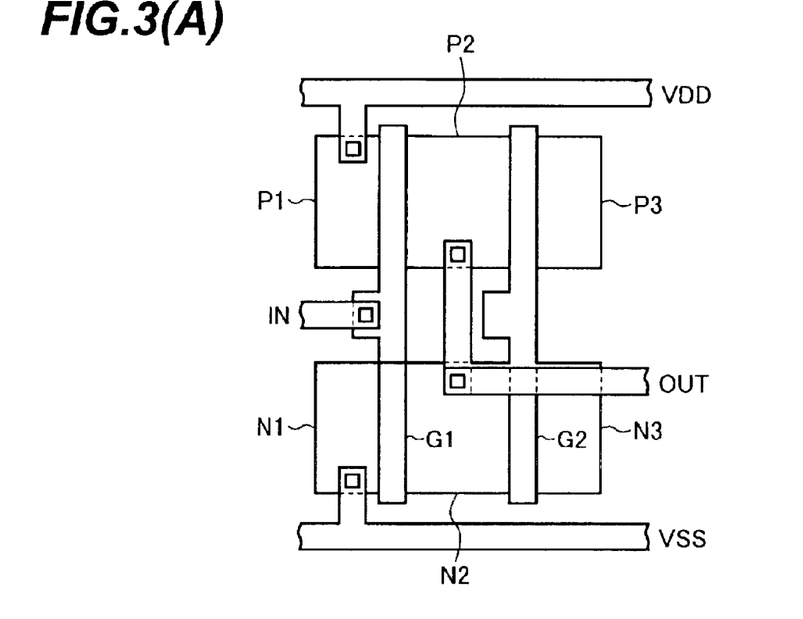
FIGS. 3(A) and 3(B) are views respectively showing pattern-examples of circuits shown FIGS. 2(A) and 2(B).
Figure 3B:
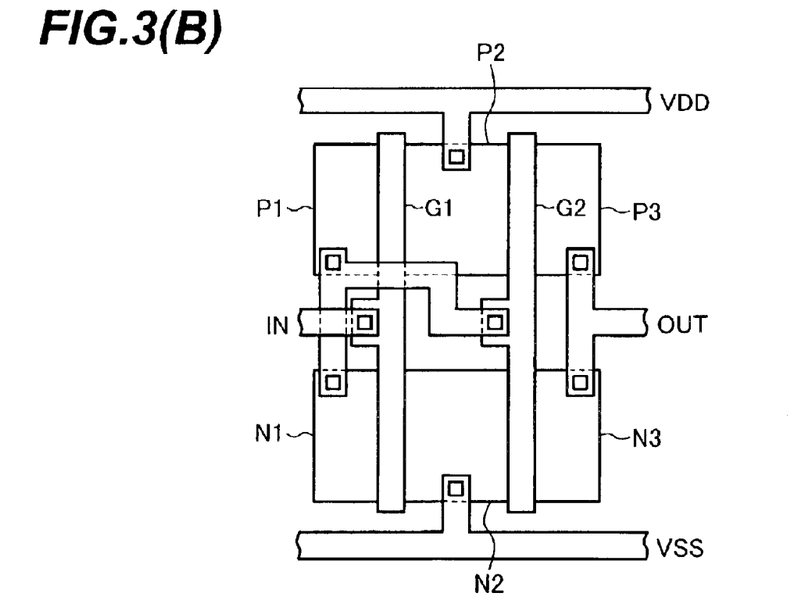

FIGS. 3(A) and 3(B) show respectively examples of CMOS-pattern embodying the circuits of FIGS. 2(A) and 2(B). In FIGS. 3(A) and 3(B), VDD and VSS denote power supply wires; G1 and G2 denote gate lines; IN and OUT denote input and output wires, respectively; and P1 to P3 and N1 to N3 denote P-type and N-type regions, respectively.

Transistors of the Output-stages of the external buffer cells 20 are larger in size than those of the input terminals of the internal circuit 21, and have a driving capability for enabling direct driving of transistors inside the chip that are connected thereto through a wire having the maximum inter-module length, that is, the sum 2L (corresponding to the maximum Manhattan length) of lengths of two neighboring sides in module-disposed region.

The module 14 is supplied with a power source from an upper-layer power source wire through an inter-layer contact.

The modules 13 and 15 have the same configuration as the module 14. The module 15 includes a macro cell 23X as a portion of the circuit 23 disposed inside the external buffer cells 22.

In the automatic wiring in the top level, wiring processes are performed between the modules 13 to 18 and between the modules 13 to 18 and the plurality of I/O cells 12. With the help of the driving capability of the external buffer cells, there is no need to insert repeater cells on the route of the wires, such as wires between the modules 13 to 15, wires between the modules 13 to 15 and the plurality of I/O cells 12, and wires for providing signals from the modules 13 to 15 to the modules 16 to 18. FIG. 1 illustrates a wire 25 for direct connection between the external buffer cells 24 of the module 13 and the external buffer cells 22 of the module 15.

This connection allows simplifying the configuration of connection, greatly reducing the number of timing-error adjusting positions, and greatly reducing the number of repeated times of timing-error checking and layout correcting processes, in result of shortening the design period.

Wires made in the top level may have pitch and width larger than those of the internal circuit with the help of the above-mentioned driving capability of the external buffer cells.

Based on the driving capability required of the external buffer cells 20, the size of the external buffer cells 20 is determined, and thereby the size of the module 14 is determined, whereby the number of external buffer cells, allowable in arrangement, is determined. Accordingly, when the number of external buffer cells 20 is not sufficient, there is a need to change the design of the module 14.

Figure 4:
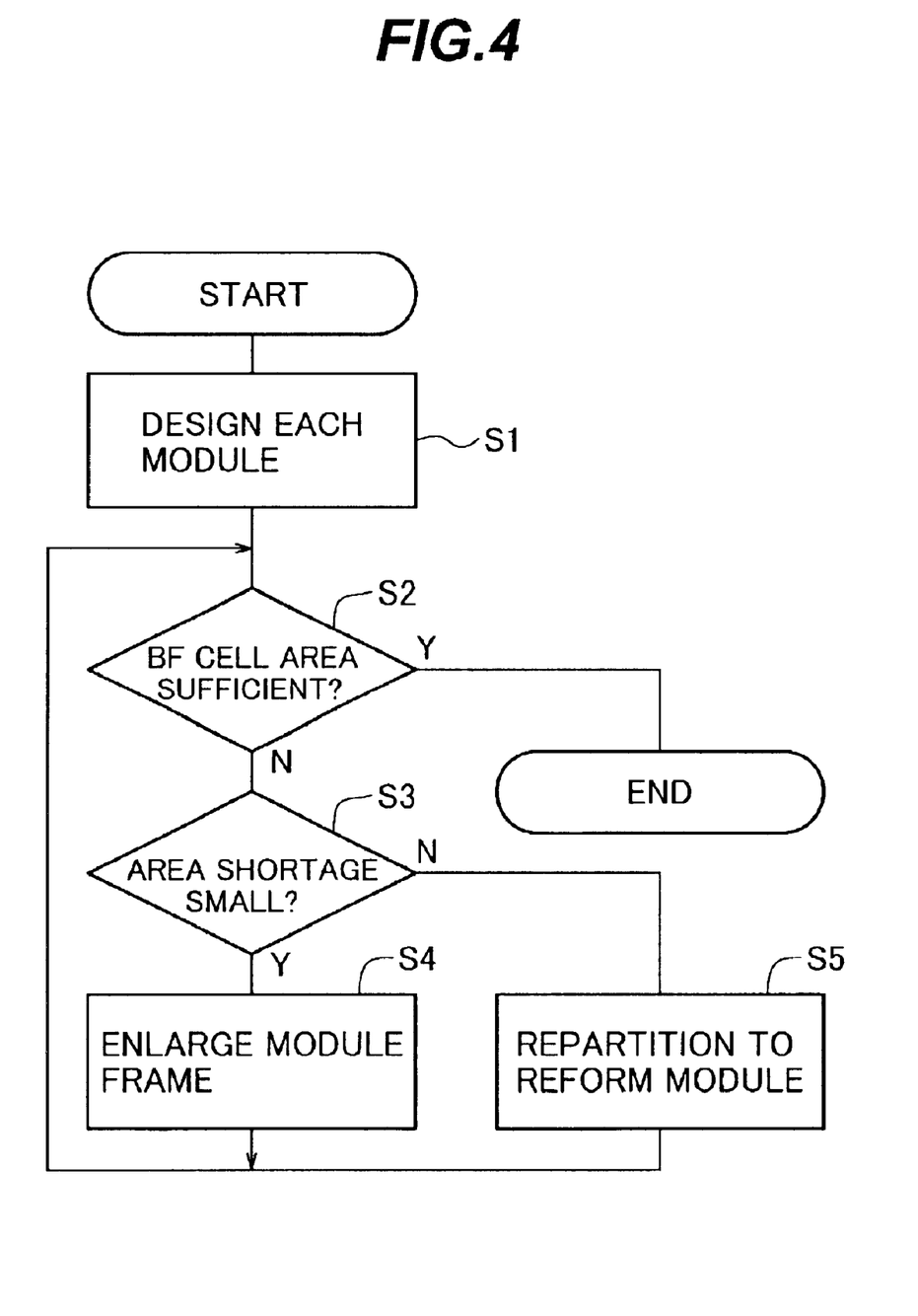
FIG. 4 is a flow chart showing a procedure of the design change of modules when the area of external buffer cells is not sufficient.

FIG. 4 is a flow chart showing the design change procedure.

(S1) Layout design is performed for each of modules of the top level.

(S2) When there is a module insufficient in the number of external buffer cells, that is, insufficient in the area of external buffer cells, the procedure moves to step S3 and if not, the procedure is finished.

(S3) When the shortage of area of external buffer cells is smaller than a predetermined value, the procedure moves to step S4, and if not, moves to step S5.

Figure 5A:
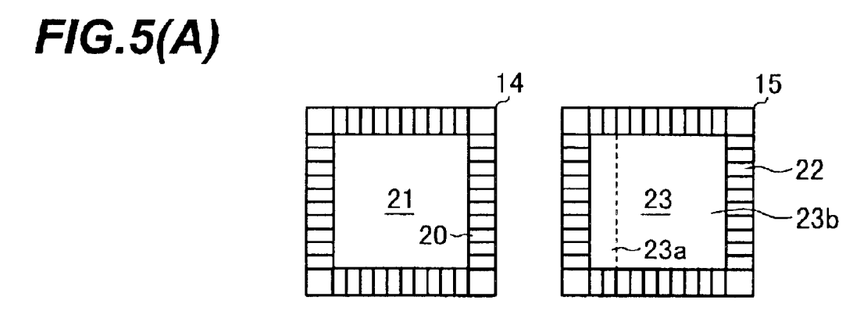
FIGS. 5(A) to 5(C) are views for illustrating the procedure of the design change of modules shown in FIG. 4.
Figure 5B:
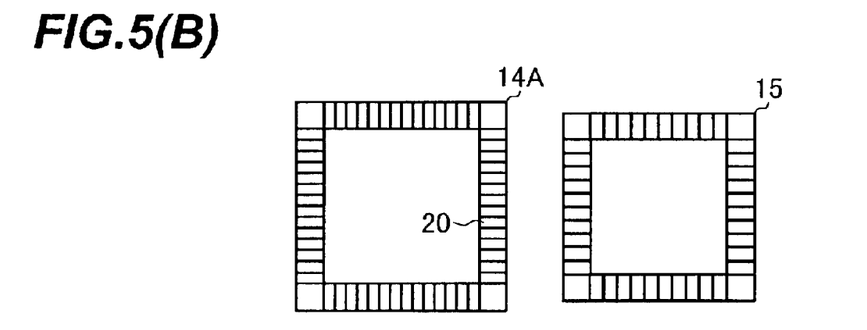

(S4) The frame of the module is enlarged in size so as to remove the shortage of area. For example, when the area of the external buffer cells 20 of the module 14 is not enough as shown in FIG. 5(A), the shortage of area of the external buffer cells 20 is removed by enlarging the frame of the module 14 to become a module 14A as shown in FIG. 5(B). Thereafter, the procedure returns to step S2.

Figure 5C:
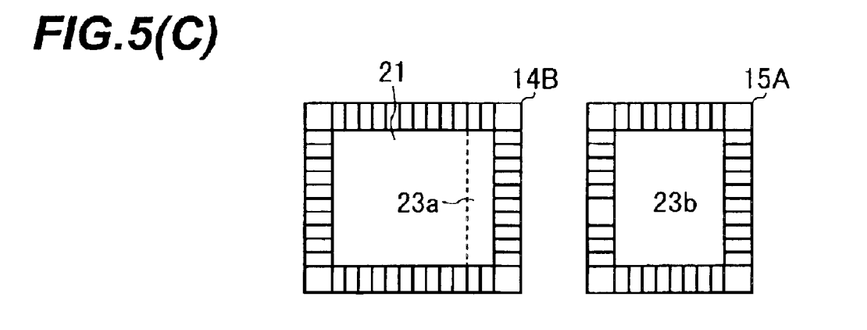

(S5) Repartition is performed for modules connected to each other so as to amend the size of each module and the required number of external buffer cells, in result of removing the shortage of area of external buffer cells. For example, the internal circuit 23 is partitioned into circuits 23a and 23b as shown in FIG. 5(A) and the internal circuit 23a is moved into the module 14, thereby forming a module 14B and a module 15A as shown in FIG. 5(C).

Figure 6A:
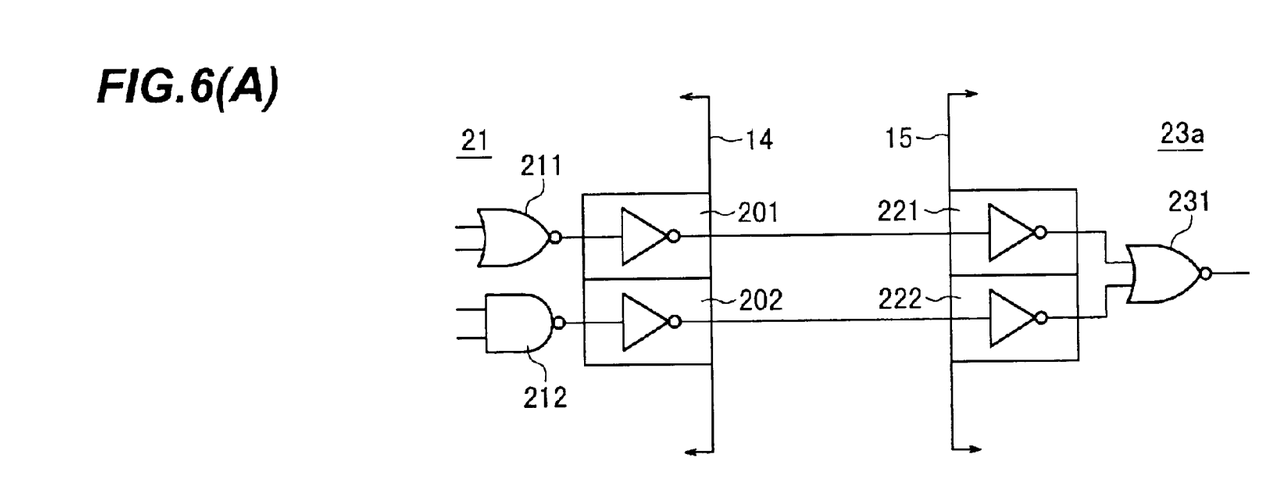
FIGS. 6(A) and 6(B) are views partially showing the logic circuit for explaining a step S5 shown in FIG. 4.
Figure 6B:
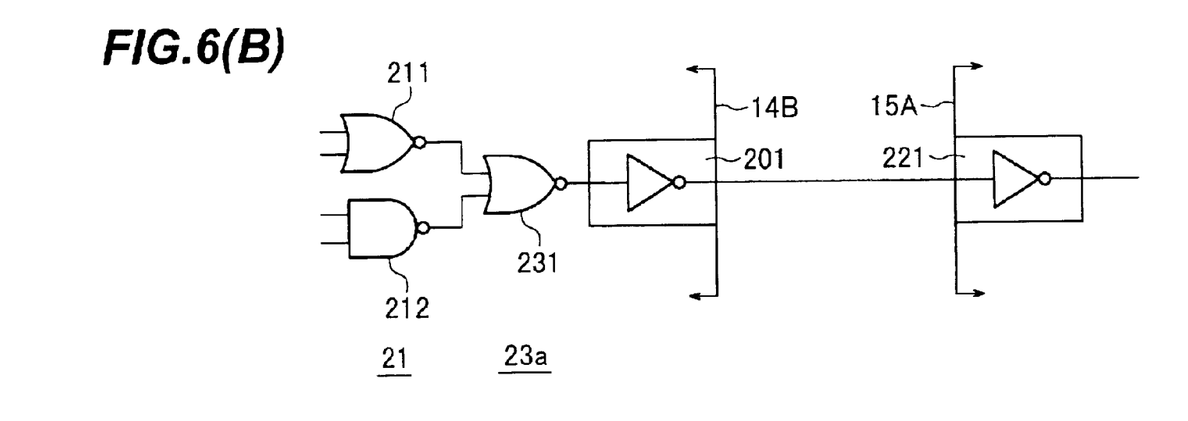

This allows also reducing the required number of external buffer cells as shown in FIG. 6. For example, let us consider, as shown in FIG. 6(A), a case where outputs of a NOR gate 211 and a NAND gate 212 included in the internal circuit 21 are respectively connected to external buffer cells 221 and 222 of the module 15 through external buffer cells 201 and 202 of the module 14, and outputs of the external buffer cells 221 and 222 are connected to a NOR gate 231 included in the internal circuit 23a. In this case, performing the partition and amendment of module to move the NOR gate 231 into the module 14 and make the connection thereof as shown in FIG. 6(B) permits removing the necessary of the external buffer cells 202 and 222 shown in FIG. 6(A) and also reducing the required number of the external buffer cells of module.

Thereafter, the procedure returns to step S2.

Figure 7:
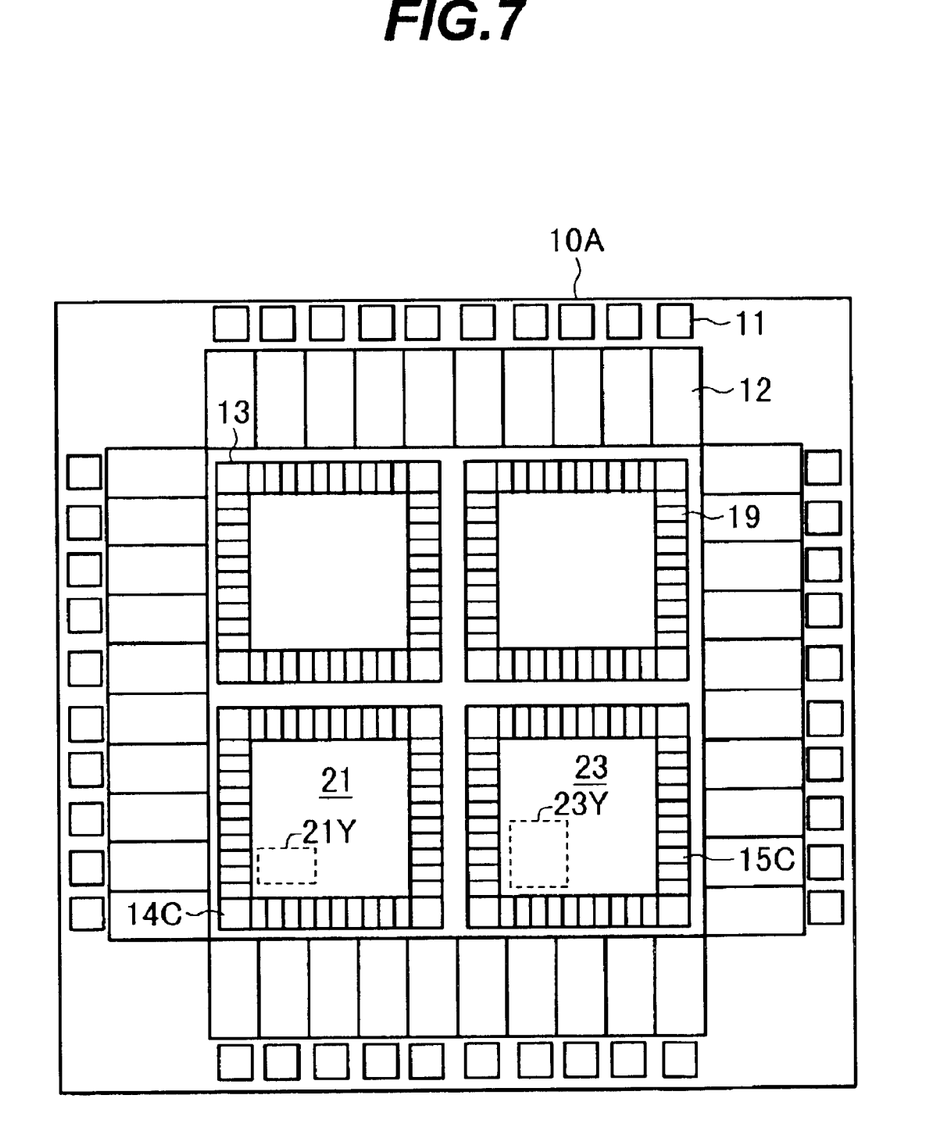
FIG. 7 is a view showing an example modified from the module arrangement of the top level shown in FIG. 1.

FIG. 7 shows a modified example to the arrangement shown in FIG. 1, where the top level of a chip 10A are composed only of modules 13, 14C, 15C and 19, all of which have external buffer cells 20 formed along each periphery. The internal circuit 21 of the module 14C includes a macro cell 21Y as a portion thereof, and the internal circuit 23 of the module 15C includes a macro cell 23Y as a portion thereof.

Figure 8:
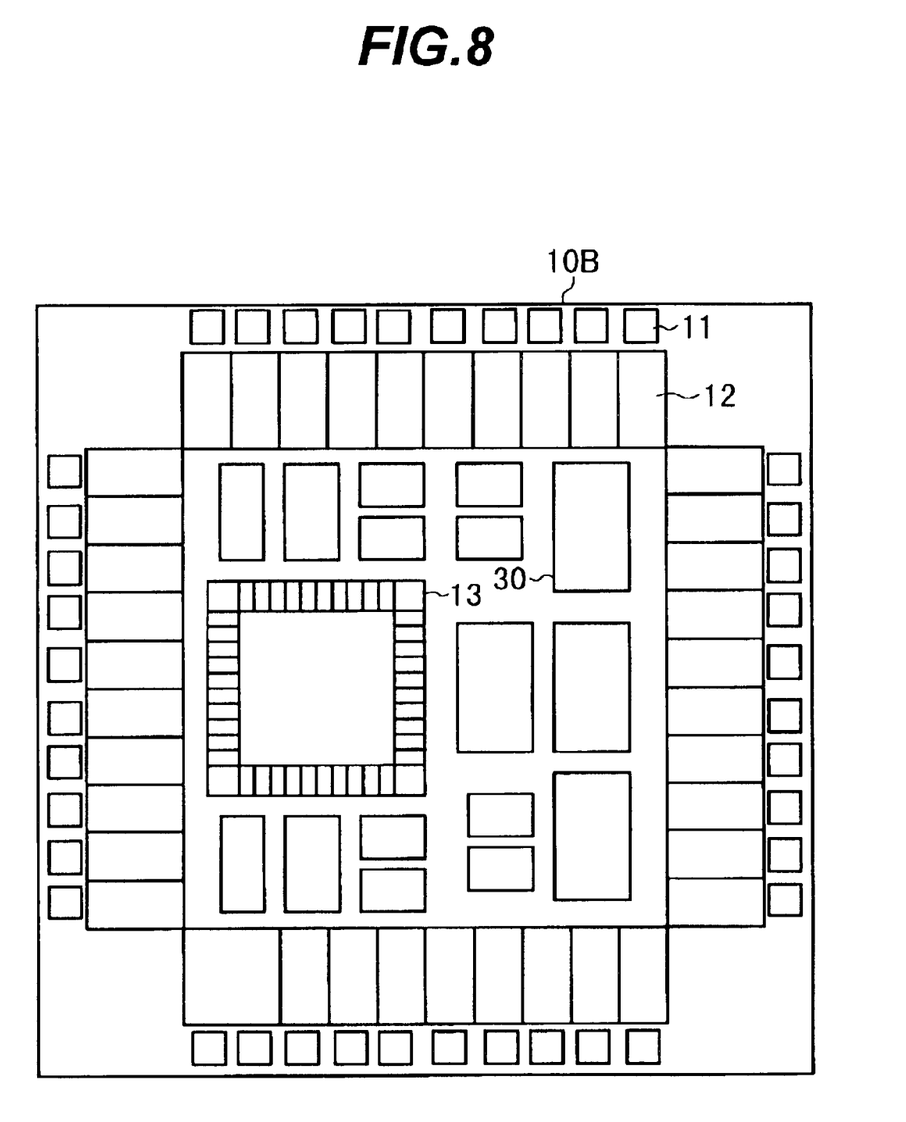
FIG. 8 is a view showing another example modified from the module arrangement of the top level shown in FIG. 1.

FIG. 8 is a view showing another example modified from the arrangement shown in FIG. 1, where the top level of a chip 10B are composed of one module 13 having external buffer cells formed along its periphery and a plurality of macro cells (modules) 30 having fixed terminal position. The above-mentioned advantages can be obtained, if there is provided at least one module having the external buffer cells according to the present invention.

In addition, the automatic wring design of the top level may be performed after or before performing the design of each of modules. Furthermore, a part of the plurality of external buffer circuits may belong to a power source terminal.

Although preferred embodiment of the present invention has been described, it is to be understood that the invention is not limited thereto and that various changes and modifications may be made without departing from the spirit and scope of the invention.

What is claimed is:

1. An integrated logic circuit having a module disposed inside a chip, said module comprising:
   an internal circuit; and
   a plurality of external buffer cells, disposed along a periphery of the internal circuit, through which signal input/output is made between the internal circuit and a first external circuit that is inside the chip and outside the plurality of external buffer cells,
   wherein each of the external buffer cells has a driving capability for enabling direct driving of a transistor inside the chip through a wire having a maximum Manhattan length in a module-disposed region on the chip.

2. The integrated logic circuit according to claim 1, wherein each of the external buffer cells includes an output stage transistor having a larger size than a transistor size of the internal circuit.

3. The integrated logic circuit according to claim 1, wherein the module is a plurality of modules including first and second modules, wherein one of the external buffer cells of the first module is directly connectable through a wire to one of the external buffer cells of the second module.

4. The integrated logic circuit according to claim 1, further comprising a second external circuit that is disposed inside the chip and outside the module, wherein an output-buffer cell of the external buffer cells of the module is directly connectable through a wire to the external circuit.

5. The integrated logic circuit according to claim 4, wherein at least one of the external buffer cells has one inverter or more than two cascaded inverters.

6. The integrated logic circuit according to claim 4, wherein at least one of the external buffer cells has a flip-flop.

* * * * *